(12) United States Patent
Sanada et al.

(10) Patent No.: US 6,498,753 B2
(45) Date of Patent: Dec. 24, 2002

(54) SEMICONDUCTOR STORAGE DEVICE AND PRODUCTION METHOD THEREOF

(75) Inventors: Kazuhiko Sanada, Tokyo (JP); Kenji Saitou, Tokyo (JP); Kiyokazu Ishige, Tokyo (JP); Hitoshi Nakamura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/944,792

(22) Filed: Aug. 31, 2001

(65) Prior Publication Data

US 2002/0008995 A1 Jan. 24, 2002

Related U.S. Application Data

(62) Division of application No. 09/725,633, filed on Nov. 29, 2000, now Pat. No. 6,330,191.

(30) Foreign Application Priority Data

Nov. 29, 1999 (JP) ............................................ 11-338634

(51) Int. Cl.[7] .............................................. G11C 16/04
(52) U.S. Cl. ............................. 365/185.24; 365/185.01
(58) Field of Search ....................... 365/185.24, 185.01, 365/185.29, 185.28, 185.27

(56) References Cited

U.S. PATENT DOCUMENTS 5,805,501 A    9/1998 Shiau et al. ........... 365/185.29
6,166,960 A  * 12/2000 Marneweck et al. ... 365/185.24

* cited by examiner

*Primary Examiner*—David Lam
(74) *Attorney, Agent, or Firm*—Katten, Muchin, Zavis, Rosenman

(57) ABSTRACT

The present invention enables to complete a data erase of memory cells of a group in a semiconductor storage device where a data erase is uniformly performed to memory cells of a group until all the cell threshold values become below a reference and memory cells having a cell threshold value below a lower limit are supplied with an electric charge. When a production error occurs in such a way that some memory cells in a predetermined position of a group have a lower erase speed, the semiconductor device is formed in such a way that these memory cells have an erase speed higher than an ideal value. When some memory cells of a group have a lower erase speed, an excessive erase is performed in most memory cells of the group requiring electric charge supply, which increase the erase time as a whole.

10 Claims, 8 Drawing Sheets

SEMICONDUCTOR STORAGE DEVICE AND PRODUCTION METHOD THEREOF

CROSS REFERENCE TO RELATED APPLICATION

This is a divisional of application Ser. No. 09/725,633, filed on Nov. 29, 2000 now U.S. Pat. No. 6,330,191.

BACKGROUND OF THE INVENTION

1. Field of the Invention

The present invention relates to a semiconductor storage device such as an electrically erasable programmable read only memory (EEPROM) and in particular, to a semiconductor storage device made from an all-at-once erasable flush memory.

2. Description of Related Art

Currently, various memory devices are uses in various electronic apparatuses. Among such memory devices, there are those which retain a binary data in a rewritable and nonvolatile manner.

The flash memory can be divided into several groups according to an internal structure and a writing method. For example, there are NAND type and NOR type. The NOR type may be AND type or DINOR (divided bit line NOR) type. The DONOR type is considered to be advantageous because of its high speed operation while the AND type is considered to be advantageous for high integration.

Here, explanation will be given on a conventional example of such a semiconductor storage device with reference to FIG. 4 to FIG. 10. It should be noted that FIG. 4 is a plan view schematically showing an entire configuration of a flash memory as the semiconductor storage device; FIG. 5 is a plan view schematically showing a layered configuration of memory cells; FIG. 6 is a schematic front view showing a cross section about X—X in FIG. 5; FIG. 7 is a schematic side view showing a cross section about Y—Y in FIG. 5; FIG. 8 schematically shows a state for writing a data in a memory cell; FIG. 9 schematically shows a state for erasing a data in a memory cell by the substrate erase method; and FIG. 10 shows a cell threshold value characteristic to memory cells.

Here, a flash memory 100 as a conventional example of the semiconductor storage device. includes numerous memory cells 101 which are arranged on the surface of a semiconductor substrate 102 in a two-dimensional structure. As shown in FIG. 4, the memory cells 101 are grouped into a plurality of sectors 103.

Each memory cell 101 consists of at least one MOS transistor having, as shown in FIG. 5 to FIG. 7, a source region 111, a drain region 112, a floating gate (FG) 113, a control gate (CG) 114, insulation films 115, 116 and the like. Each of the regions 111 and 112 is a diffused layer formed on the semiconductor substrate 102. The FG 113 is located on a diffused layer 117 between the regions 111 and 112.

As has been described above, a plurality of sectors 103 are arranged in the two-dimensional manner on a semiconductor substrate 102 of the flash memory 100, and on each of the sectors 103, there are arranged a plurality of memory cells 101. These memory cells 101 are separated from one another by an element isolation region 118 of LOCOS (local oxidization of silicon) and STI (shallow trench isolation).

It should be noted that in the intermediate region between adjacent sectors 103, various circuits are arranged including a line decoder, a column decoder, a column selection circuit, a sense amplifier, and the like. For example, the plurality of sectors 103 are arranged in the column direction via a space of "510 ($\mu$m)", where the column selection. circuit (Y selector) is arranged.

Moreover, the plurality of sectors 103 are arranged in the line. direction via a space of "330 ($\mu$m)", where the line decoder (X decoder) is arranged. It should be noted that the space in the line direction of the plurality of sectors 103 where no such circuit is arranged is formed with a width of, for example, "65 ($\mu$m)".

In the flash memory 100 having the aforementioned configuration, a binary data can be written in each of the memory cells 101. When writing a new data or rewriting a data stored in the flash memory 100, the stored data in memory cells 101 are erased on the sector 103 basis immediately before the writing.

When writing a binary data in a memory cell 101, as shown in FIG. 8, a predetermined potential is applied to the source region 111, the drain region 112, and the CG 114 and electric charge (electrons) is poured from the semiconductor substrate 102 into the FG 113.

Here, in the memory cell 101 where a data is to be written, for example, "0 (V)" is applied to the source region 111, "5 (V)" is applied to the drain region, and "10 (V)" is applied to the CG 114. Accordingly, an electric charge is poured into the FG 113 and the cell threshold value becomes above a write reference. Simultaneously with this, in a memory cell 101 where no data is to be written, for example, "0 (V)" is applied to the drain region 112 (not depicted) and not electric charge is poured into the FG 113, thereby the cell threshold value is retained below the erase reference.

As shown in FIG. 10, the cell threshold value of the memory cell 101 becomes above the write reference or the below the erase reference. Thus, by detecting this, it is possible to read a binary data which has been written or erased.

When performing such a data read, for example, "0 (V)" is applied to the source region 111, "1 (V)" is applied to the drain region, and "3 (V)" is applied to the CG 114, so that the current flowing through the drain region 112 is detected by the sense amplifier (not depicted) to determine the stored data to be 1 or 0.

On the other hand, when erasing data stored in all the memory cells 101 of a certain sector 103, for example, "−10 (V)" is applied to the CG 114, "+10 (V)" is applied to the diffused layer 117, and the source region 111 and the drain region 112 are made into an open state, so that as shown in FIG. 9, electric charge (electrons) is discharged from the FG 113 to the diffused layer 117. As shown in FIG. 10, thus, the cell threshold value of the memory cell 101 becomes below the erase reference and in this memory cell 101, the stored data has been erased.

It should be noted that the aforementioned data erase in the memory cell 101 is performed for each of the sectors 103. Accordingly, until the cell threshold values of all the memory cells 101 in that sector 103 become below the erase reference, data erase is uniformly performed in all the memory cells 101 of the sector 103.

However, because of the production errors, the erase speed is not completely identical in all the memory cells 101. Accordingly, if the data erase is uniformly performed in all the memory cells 101 one sector, the data erase may be performed excessively in a memory cell 101 having a high erase speed.

In that memory cell 101, the cell threshold value is significantly lowered. However, if a particular memory cell 101 in the flash memory 100 has a too low cell threshold value, there arise a problem of read failure. For example, in an ordinary NOR type cell array, drain regions 112 of a plurality of memory cells 101 are connected to a single bit line. When a predetermined voltage such as "3 (V)" is applied to one of the word lines (CG 114) of the plurality of the memory cells 101, the memory cell 101 connected to that word line is selected and the stored data is read out.

Here, if the selected memory cell 101 contains a written data, no detection current is generated and the stored data is determined to be "1" by the sense amplifier, and if the selected memory cell 101 contains no written data, a read current is generated and the stored data is determined to be "0".

However, in a memory cell 101 where a data erase has been performed excessively, a read current may be generated even when the predetermined voltage is not applied to the word line (CF 114). That is, even when the memory cell 101 has a written data, the stored data may be determined to be "0", causing a read failure.

In order to cope with this, in the current flash memory, as shown in FIG. 10, when a data erase is performed in a certain sector 103, electric charge is given to those memory cells 101 having the cell threshold values of the FG 113 below a predetermined lower limit value.

This is called a write-back processing or the like. While an ordinary data erase is performed for the respective sectors 103 or for the entire memory, the write-back processing is performed by detecting respective memory cells having an excessive erase. Here, an excessive erase verify is executed and if the cell threshold value is still below the lower limit, the write-back processing is again executed.

It should be noted that the above explanation has been given on the substrate erase method as the data erase method of the flash memory 100. The data erase method may also be the source erase method. In the source erase method, when erasing written data in all the memory cells 101 of a certain sector 103, as shown in FIG. 14, "−10 (V)" is applied to the CG 114, "+10 (V)" is applied to the source region, "0 (V)" is applied to the diffused layer, and the drain region 112 is in the open state. Thus, electrons are discharged from the FG 113 to the source region 111 and the written data in the memory cells 101 is erased.

In the aforementioned flash memory 100, a binary data can be written into memory cells 1001 by making the cell threshold value of the FG 113 above the write reference and the stored data in the memory cells 101 can be erased by making the cell threshold value of the FG 113 below the erase reference. The data erase is performed uniformly in the numerous memory cells of a single sector 103. Those memory cells 101 having the cell threshold values below the lower limit are supplied with electric charge and no problem such as leak current is caused.

However, this electric charge supply requires a time, increasing the erase time of the sector 103. Accordingly, the number of memory cells 101 requiring electric charge supply is preferably as small as possible. If the erase speeds of all the memory cells 101 in a sector 103 are completely identical, no excessive data erase is caused and no electric charge supply is required, thereby reducing the erase time of the sector 103.

In an actual memory cell 101, each part consists of a diffused region and a layered film. As the portions associated with the erase speed, as shown in FIG. 5 and FIG. 7, there are a diffused layer width W, an overlap B of the FG 113 with respect to the element isolation region 118, and the like. It should be noted that the diffused layer width W, as shown in FIG. 5 and FIG. 7, is a dimension in a horizontal direction in the figures equivalent to the entire length of the diffused layer between the element isolation regions 118.

When a memory cell 101 of the flash memory 100 of the substrate erase method is expressed in a capacitance equivalent circuit, as shown in FIG. 11, a capacitance C1 between the FG 113 and the diffused layer 117, a capacitance C2 between the FD 113 and the CG 114, a potential difference VFG between the FG 113 and the diffused layer 117, and a potential difference VCG between the FG 113 and the CG 114 satisfy a relationship as follows:

$$VFG=(C2/C1) \times VCG$$

For example, when the capacitance C2 between the FG 113 and the CG 114 is constant, if the aforementioned diffused layer width W increases, the capacitance C1 also increases. Accordingly, the potential difference VFG is lowered to lower the erase speed. Moreover, if the diffused layer width W is constant and the overlap B is reduced, the capacitance C2 is also lowered, thereby reducing the potential difference VFG to lower the erase speed.

On the other hand, when a memory cell 101 of a flash memory 100 of the source erase method is expressed in a capacitance equivalent circuit, as shown in FIG. 15, a capacitance C1 between the FG and the diffused layer 117, a capacitance C2 between the FG 113 and the CG 114, a capacitance Ce between the FG 113 and the source region 111, a potential difference VS between the CG 114 and the source region 111, and a potential difference VSG. between the FG 113 and the source region 111 satisfy a relationship as follows:

$$VSG=(C1+C2)/(C1+C2+Ce) \times VS$$

Accordingly, in the flash memory 100 of the source erase method, if the diffused layer width W is increased, the capacitance C1 and the potential difference VSG are increased, thereby lowering the erase speed, and if the overlap B is reduced, the capacitance C2 and the potential difference VSG are lowered, thereby increasing the erase speed.

Accordingly, in either of the erase methods of the flash memory 100, if the diffused layer width W and the overlap B in all the memory cells 101 of one sector 103 are identical, the erase speeds are also identical. However, when the flash memory 100 was actually produced, it was found that the diffused layer width W and the overlap B in a sector cannot be made identical due to the production technique and the production condition.

For example, when a flash memory 100 of the substrate erase method is produced, as shown in FIG. 12, the diffused layer width W may be greater in a central region than in end regions of the sector 103. If data erase is performed in a sector 103 of a substrate erase type flash memory having such a configuration, the erase speed is lowered in the memory cells 101 in the end regions.

However, the data erase is performed until the cell threshold values of all the memory cells 101 in the sector 103 become below the erase reference. Accordingly, as shown in FIG. 13, when the data erase is at a low speed only in some memory cells .101, the data erase is performed in the most of the memory cells 101 more than necessary.

For this, when a data erase is performed in a sector 103, most of the memory cells 101 in the center region often have cell threshold values below the lower limit and a plenty of memory cells 101 require write-back, which results in increase of the erase time of the sector 103.

On the contrary, when a flash memory of the source erase type is produced, the diffused layer width W may become smaller in the end regions of the sector 103 than in the center region. However, in this case also, a plenty of memory cells 101 require a write-back processing in the sector 103 where the data erase is performed and the erase time is increased.

It should be noted that in order to prevent the aforementioned production irregularities, there is a technique to produce a dummy pattern similar to the memory cell 101 up to the outer side of the sector 103. However, this is not preferable because this lowers the productivity of the flash memory 100 and increases the apparatus size.

SUMMARY OF THE INVENTION

It is therefore an object of the present invention to provide a semiconductor storage device capable of uniform data erase in a group of memory cells with a reduced number of cells in which the data erase is excessively performed and completing the data erase at a high speed, and a production method thereof.

The semiconductor storage device according to the invention comprises a group of memory cells arranged in a two-dimensional state on a semiconductor substrate, wherein a binary data write is performed by pouring electric charge into each of the memory cells of the group until a cell threshold value reaches a predetermined write reference while a binary data erase is performed by uniformly discharging the electric charge from the memory cells until all the cell threshold values become below a predetermined erase reference and those memory cells subjected to the data erase and having cell threshold values below a lower limit are supplied with an electric charge, the device being characterized in that when a production error occurs in such a way that an erase speed of memory cells in a predetermined position of the group differs from an ideal value, the device is formed with such a configuration that in the memory cells in the predetermined position, the erase speed is higher than an ideal value even if the production error occurs.

Accordingly, in the semiconductor storage device of the present invention, a data write is performed to each of the memory cells while a data erase is uniformly performed to all the memory cells of a predetermined group. When a production error occurs to lower an erase speed of some memory cells at a predetermine position of the group than an ideal value, the data erase is uniformly performed in all the memory cells of the group until the data erase is complete in the memory cells subjected to the production error. Consequently the data erase is performed more than necessary in most of the memory cells of the group and a plenty of memory cells require electric charge supply.

However, the semiconductor storage device according to the present invention is formed with a such a configuration that memory cells at a position where the production error occurs have a higher erase speed than an ideal value even if the production error occurs and accordingly, the memory cells thus formed will not lower their erase speed than the ideal value even if the production error occurs. These memory cells thus formed have a higher erase speed than most of the memory cells of the group, the data erase may be performed more than necessary requiring electric charge supply.

However, in most of the memory cells other than the aforementioned, the data erase will not performed more than necessary and it is possible to reduce the number of memory cells in which the data erase is performed excessively requiring electric charge supply. It should be noted that "some memory cells" of a group means less than half of the group, for example, one tenth of the memory cells of the group.

DESCRIPTION OF THE PREFERRED EMBODIMENTS

Figure 1:
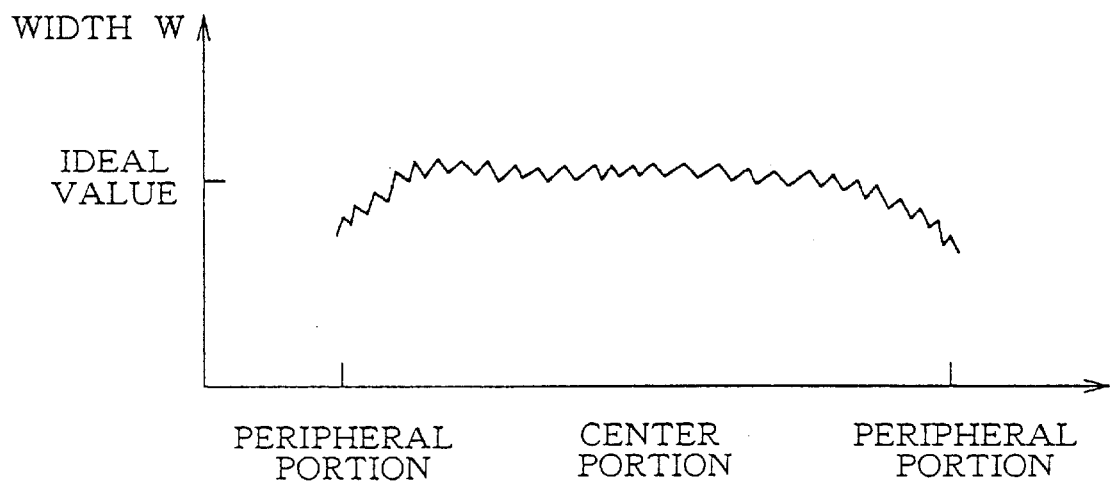
FIG. 1 shows a distribution of diffused layer width W in a sector consisting of memory cells.
Figure 2:
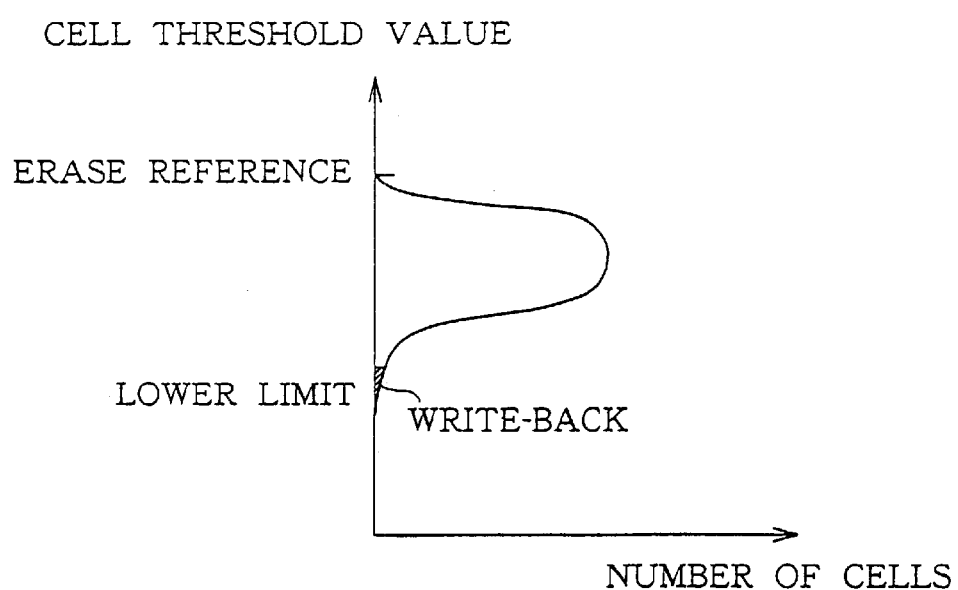
FIG. 2 shows a relationship between the cell threshold value and the number of cells among the memory cells in a sector subjected to a data erase.
Figure 3:
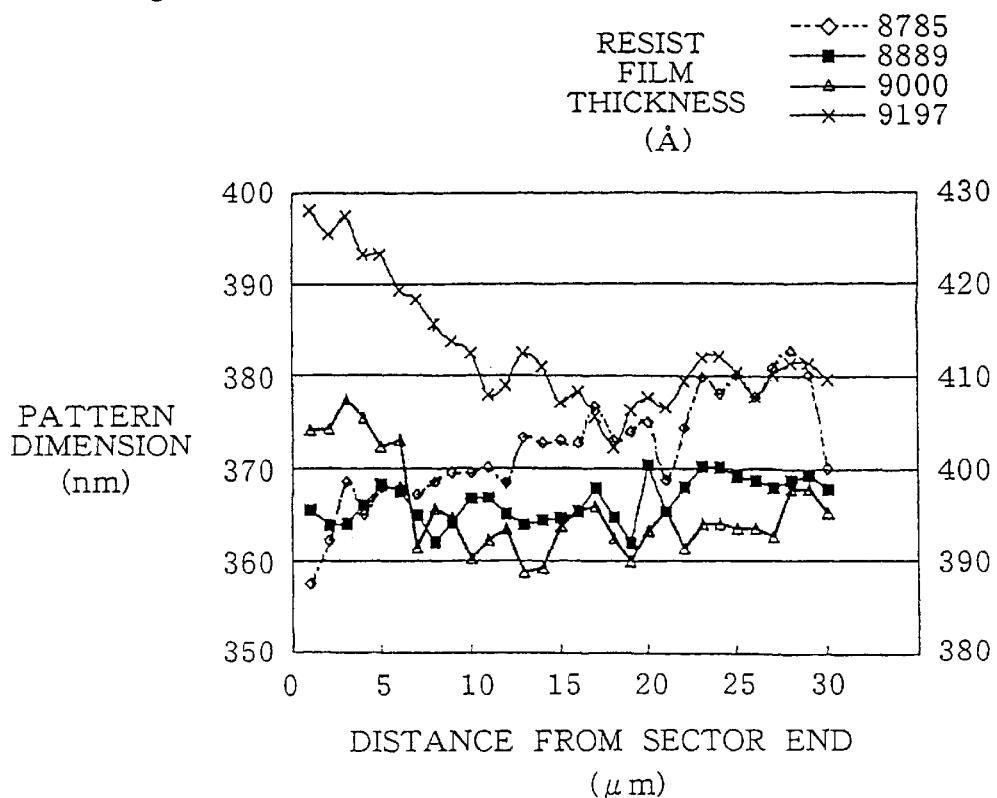
FIG. 3 shows a relationship between the resist pattern dimension and the distance from the sector peripheral portion which determines the diffused layer width in the photoresist of various film thickness values.
Figure 4:
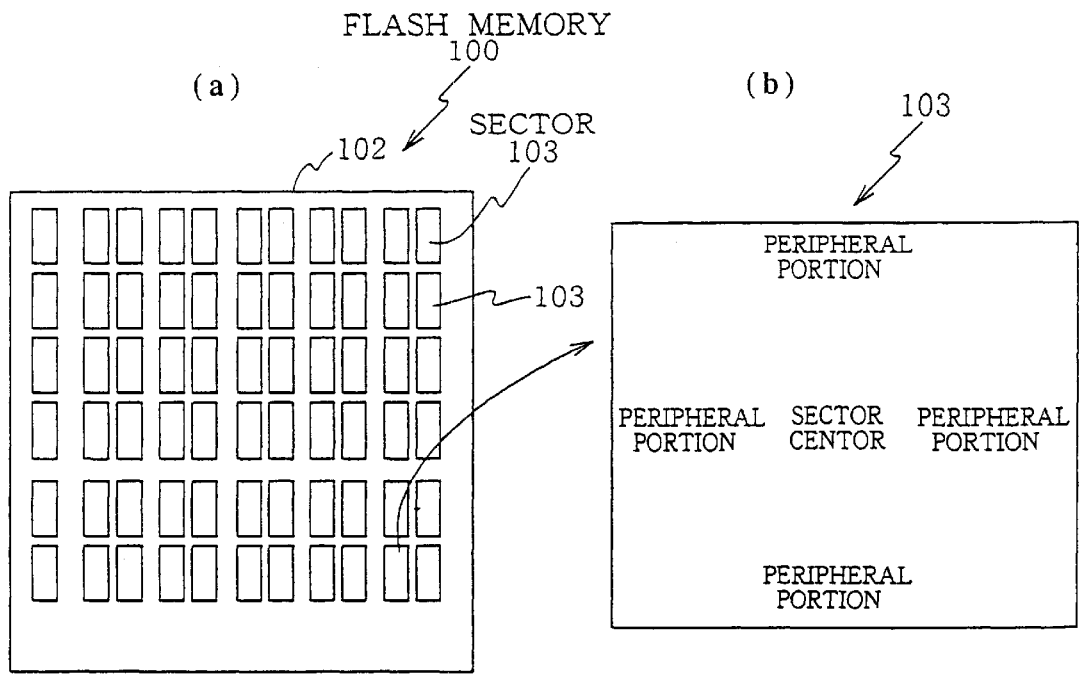
FIG. 4 is a plan view schematically shows the entire configuration of a flash memory as a semiconductor storage device.
Figure 5:
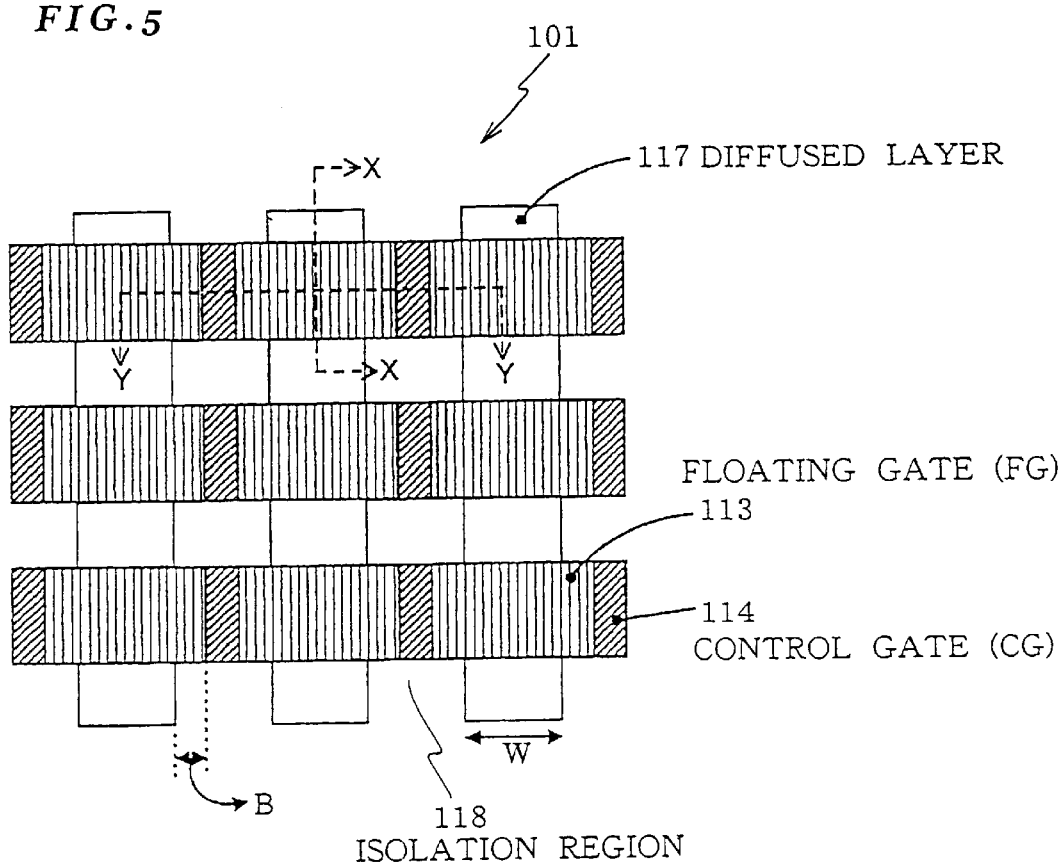
FIG. 5 is a plan view schematically showing a layered configuration of a memory cell.
Figure 6:
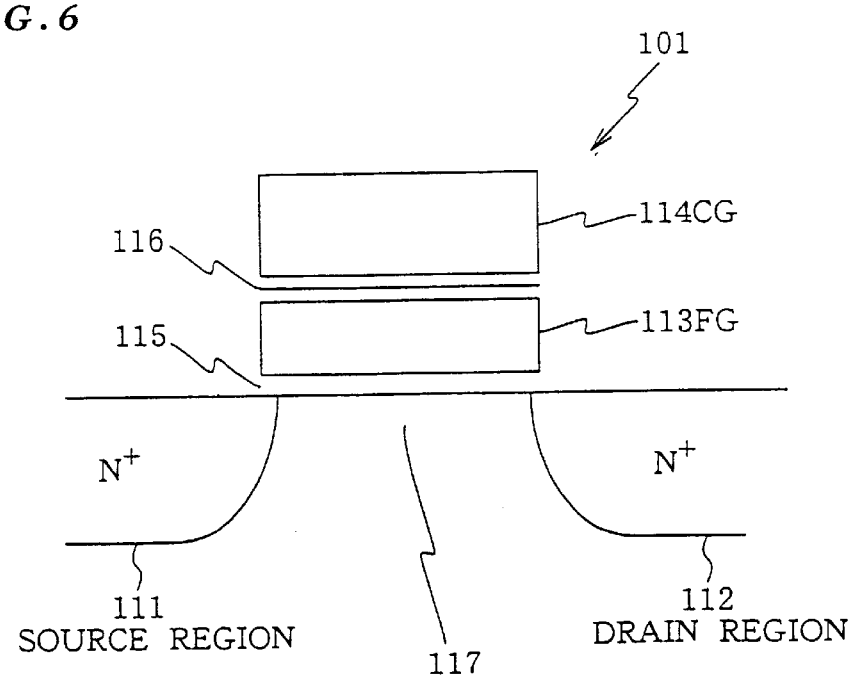
FIG. 6 is a cross sectional front view schematically showing a cross section about X—X in FIG. 5.
Figure 7:
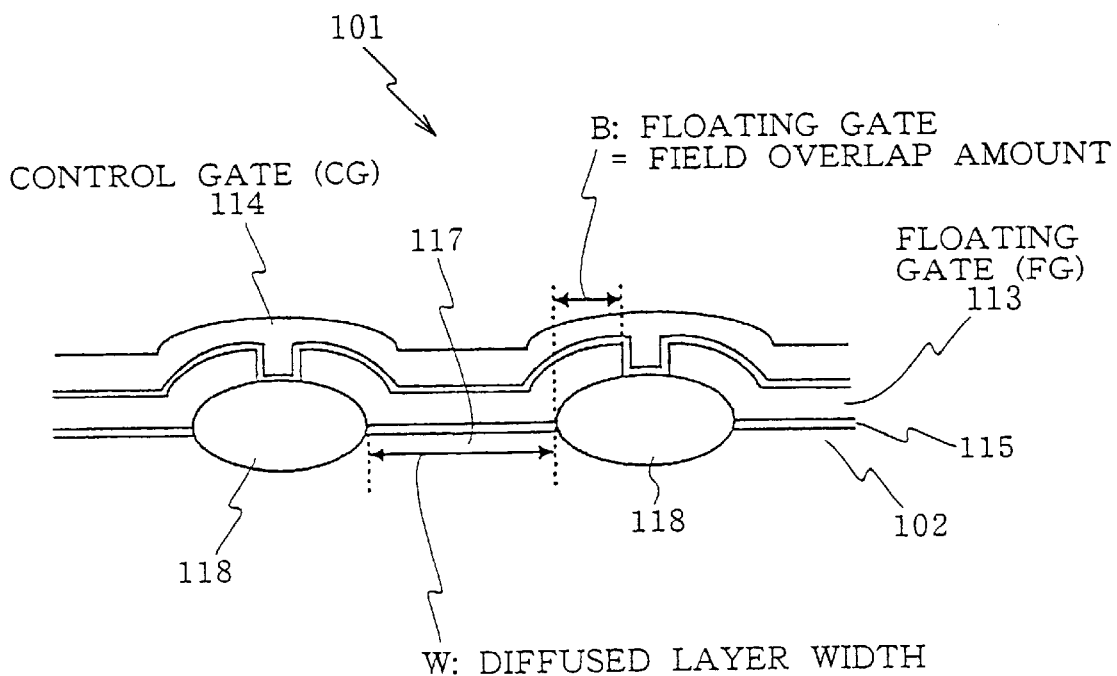
FIG. 7 is a cross sectional side view schematically showing a cross section about Y—Y in FIG. 5.
Figure 8:
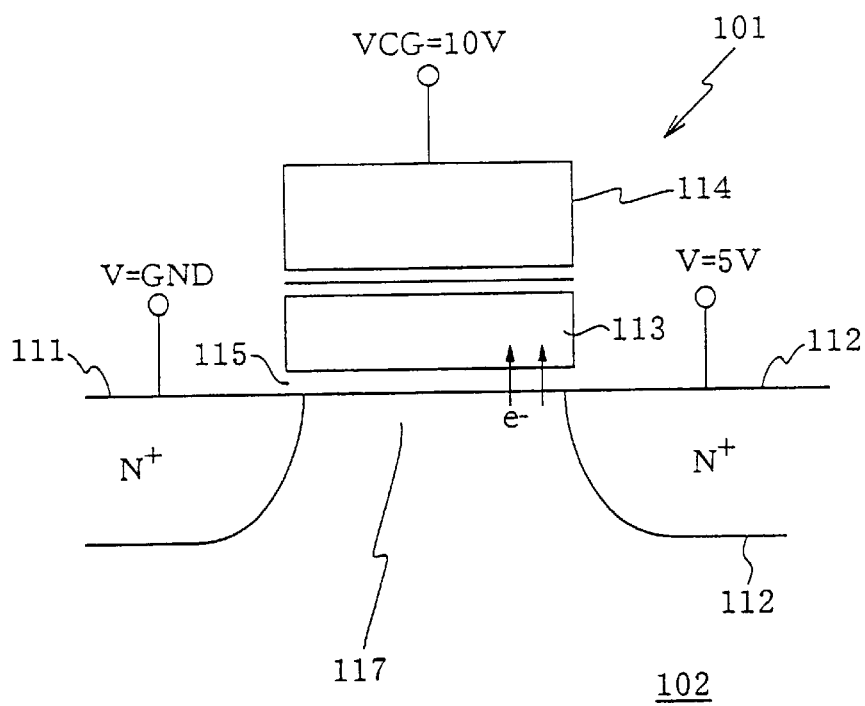
FIG. 8 schematically shows a data write performed to a memory cell.
Figure 9:
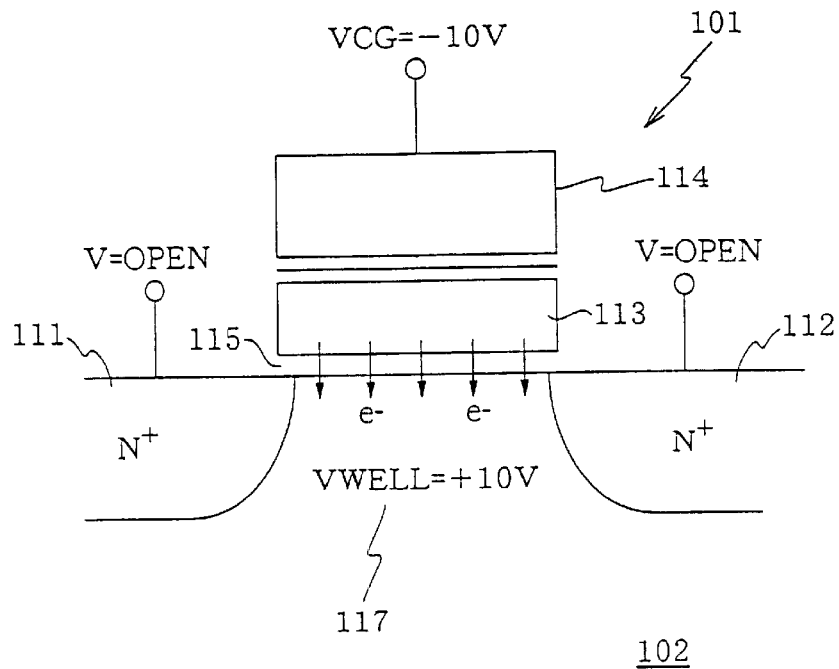
FIG. 9 schematically shows a data erase of a memory cell by the substrate erase method.
Figure 10:
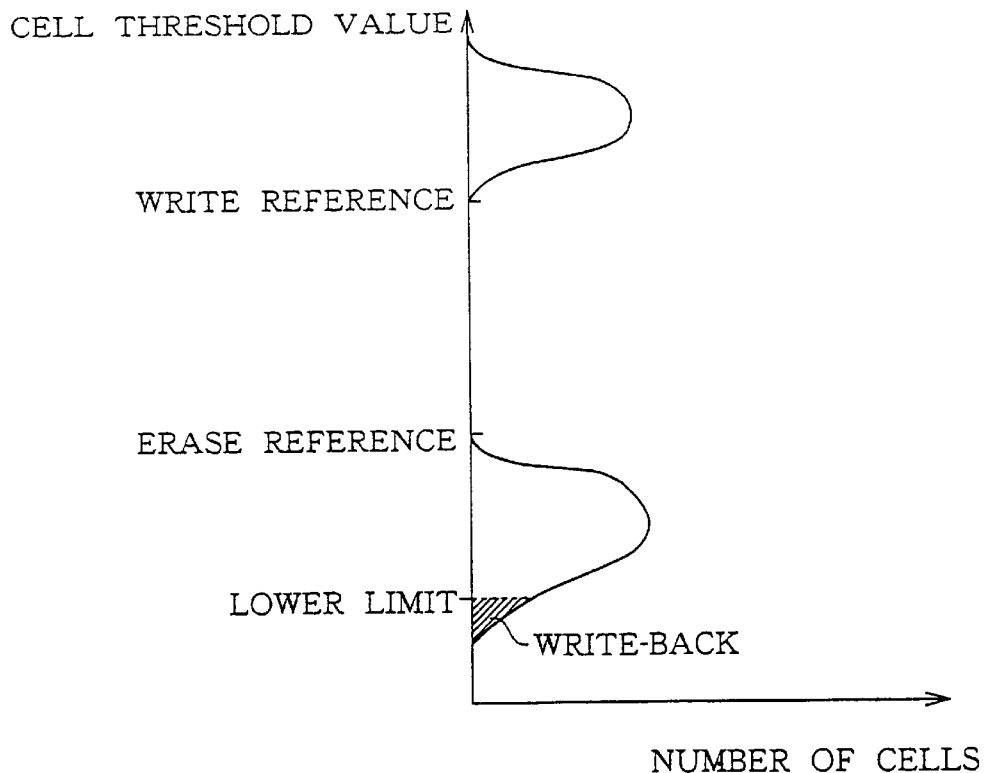
FIG. 10 graphically shows cell threshold values of memory cells.
Figure 11:
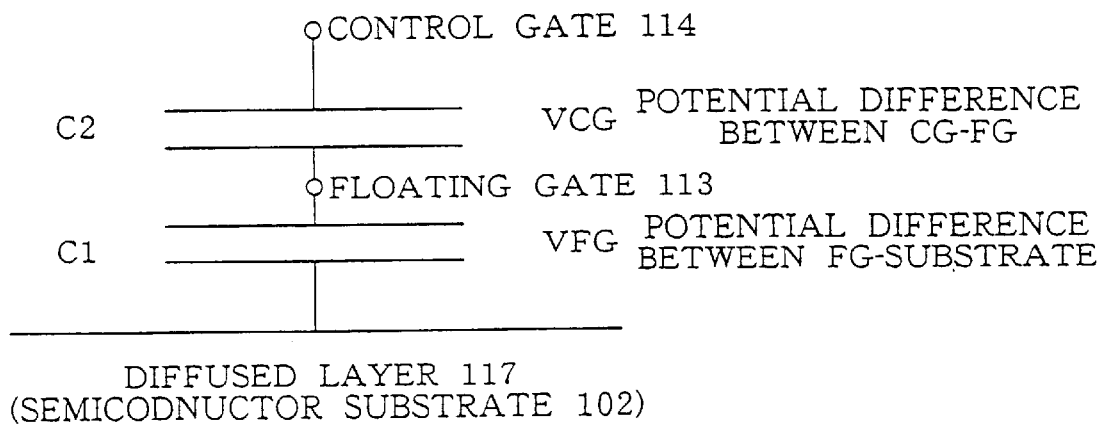
FIG. 11 is a circuit diagram showing an equivalent circuit of a memory cell of the substrate erase method expressed in capacitance.
Figure 12:
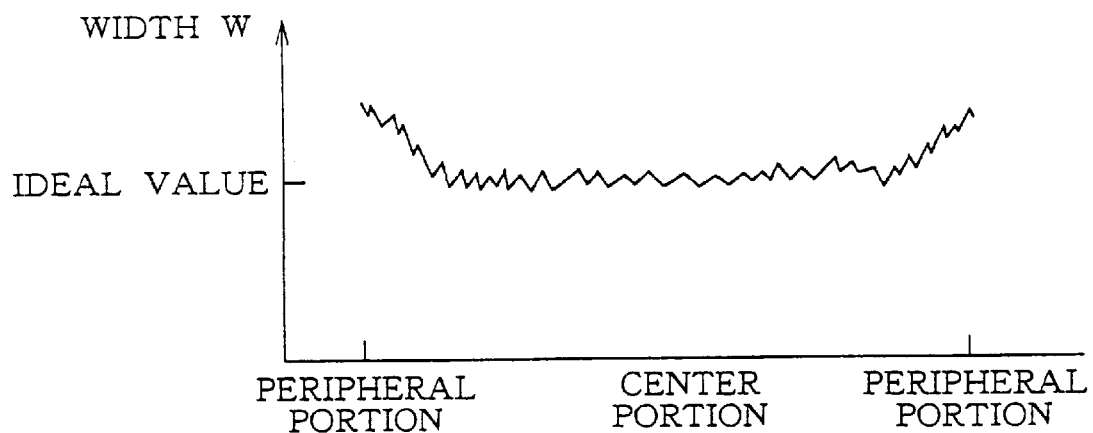
FIG. 12 shows a distribution of the diffused layer width W in a sector.
Figure 13:
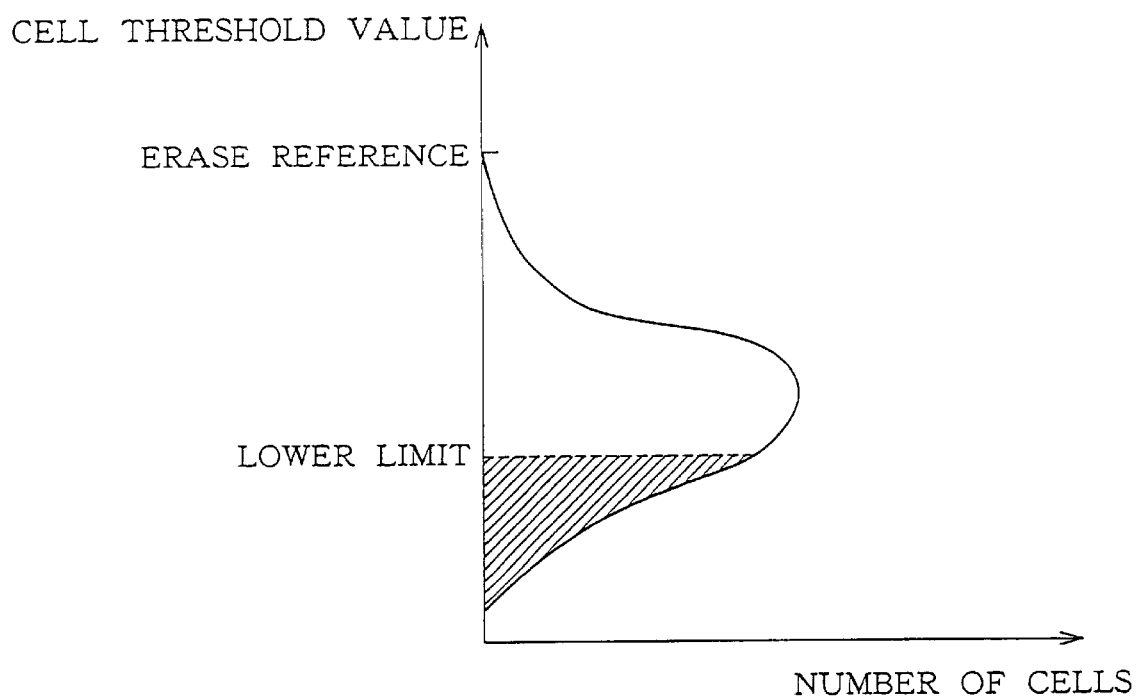
FIG. 13 shows a relationship between the cell threshold values and the number of memory cells in a sector subjected to a data erase.
Figure 14:
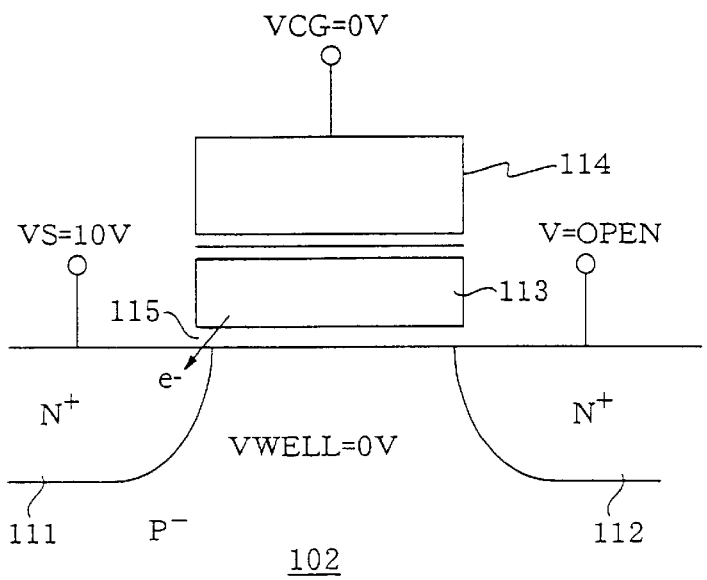
FIG. 14 schematically shows a data erase of a memory cell by the source erase method.
Figure 15:
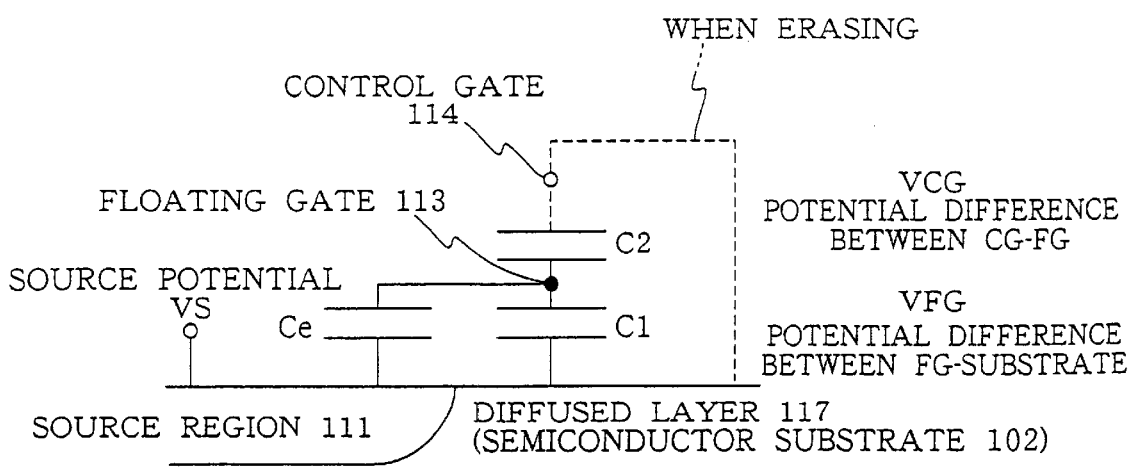
FIG. 15 is a circuit diagram showing an equivalent circuit of a memory cell of the source erase method expressed in capacitance.

Description will now be directed to an embodiment of the present invention with reference to FIG. 1 to FIG. 3. Note that like components as in the conventional example are called by like terms and denoted by like reference symbols.

FIG. 1 shows a distribution of diffused layer width W in a sector consisting of memory cells. FIG. 2 shows a relationship between the cell threshold value and the number of cells among the memory cells in a sector subjected to a data erase. FIG. 3 shows a relationship between the resist pattern dimension and the distance from the sector peripheral portion which determines the diffused layer width in the photoresist of various film thickness values.

The flash memory 100 in this embodiment also includes numerous memory cells 101 grouped into a plurality of sectors 103 in the same way as in the conventional example. Each of the memory cells 101 includes a source region 111, a drain region 112, a floating gate (FG) 113, a and a diffused layer 117.

The n-type source region 111, the n-type drain region 112, and the p-type diffused layer 117 are formed on the p-type semiconductor substrate 102 or o-type well (not depicted) and the diffused layer 117 is maintained at a potential identical to that of the semiconductor substrate 102 (or the p-type well).

In the flash memory 100 of the present embodiment which is produced in the same way with the same technique as in the conventional flash memory, a production error is caused in such a way that the diffused layer width W of the diffused layer 117 becomes greater the designed value only in the peripheral portion of the sector 103. However, in the flash memory 100 of the present embodiment, as shown in FIG. 1, the diffused layer width W of the peripheral portion of the sector 103 is formed to be smaller than the ideal value.

In the flash memory 100 of the present embodiment having the aforementioned configuration, in the same way as in the conventional example, it is possible to write a binary data in each of the numerous memory cells 101 and the data stored in the memory cells 101 can be erased on sector 103 basis by the substrate erase method.

Moreover, the flash memory 100 of the present embodiment is also produced using the conventional thin film technique. However, since the diffused layer width W at the peripheral portion of the sector 103 is designed to be smaller than the ideal value, a production error, if any, will not make the diffused layer width W in the peripheral portion greater than the ideal value.

Accordingly, in the flash memory 100 of the present embodiment, the diffused layer width W in most of the memory cells 101 in the center portion of a sector 103 is great while the diffused layer width W in some of the memory cells in the peripheral portion is small. When a data erase is performed in the sector 103 in this condition, the data erase is continued until the cell threshold values of most of the memory cells 101 in the center port i on having a great diffused layer width W become below the erase reference and accordingly, in some of the memory cells 101 in the peripheral portion having a small diffused layer width W, the data erase is performed more than necessary.

For this, in the flash memory 100 of the present embodiment, when a data erase is performed in a sector 103, as shown in FIG. 2, memory cells having cell threshold values below the lower limit and requiring supply of electric charge are found only in the peripheral portion of the sector 103.

Accordingly, in the flash memory. 100 of the present embodiment, it is possible to reduce the number of memory cells 101 requiring electric charge supply in one sector 103 and accordingly, it is possible to increase the data erase speed within a sector. Here, explanation will be given on the technique to realize the aforementioned flash memory 100.

Firstly, when producing the flash memory 100 using the thin film technique, a silicon oxide film is formed on the surface of a semiconductor wafer, which is coated with a photoresist. This photoresist is patterned by photo etching to form a resist pattern opened at the regions where sectors 103 are to be formed and at the regions in scribe line regions where alignment patterns are to be formed.

This resist pattern is used for etching the silicon oxide film to open a region for the sector 103 wider than the array region of the memory cells by about "6 ($\mu$m)". Next, the resist pattern is removed and, using the silicon oxide film as a mask, n-type impurities are ion-implanted into the semiconductor substrate to form a deep n-well in the region of the sector 103 and p-type impurities are ion-implanted to form a p-well.

Next, the semiconductor wafer is subjected to a thermal treatment in a nitrogen atmosphere so as to activate the ions and then subjected to a thermal treatment in an oxygen atmosphere so as to form a thermal oxide film of about "100 (nm)" on the surface. This thermal oxide film is removed by etching to form a stepped portion in the alignment pattern regions so as to be used at a later stage in alignment with a photo mask. Here, the region of the sector 103 is also lowered than the other region by about "100 (nm)".

Next, photoresist is dipped onto the surface of the semiconductor wafer while the semiconductor wafer is rotated at a high speed, thereby forming a resist film. This resist film is patterned with a photo mask so as to form a resist pattern on a diffused layer 117 including the regions where a source region 111 and a drain region 112 are to be formed.

After an isolation region 118 is formed, p-type impurities are implanted into the diffused layer 117 to form a polysilicon film to become a gate oxide film 115 and a floating gate (FG) 113. Next, photoresist is applied onto the surface and patterning is performed in parallel to the diffused layer 117. Using this resist pattern, the polysilicon is etched to form an isolated FG 113.

Next, an ONO film consisting of a silicon oxide film, a silicon nitride film, and a silicon oxide film is formed and a polysilicon film to become a control gate (CG) 114 is formed. Next, photoresist is applied onto the surface and patterning is performed in a direction vertical to the diffused layer 117. Using this resist pattern, the polysilicon is etched to form an isolated CG 114, thereby completing a flash memory 100.

When producing the flash memory 100 as has been described above, the diffused layer 117 is formed by the resist pattern as has been described above, and the resist pattern ahs a dimension corresponding to the diffused layer width W. The fact that the diffused layer width W is increased in the peripheral portion of the sector 103 in the conventional flash memory 100 is considered to be caused by that the dimension of the resist pattern is increased in the peripheral portion of the sector 103.

In this case, as has bee described above, there is a height difference of about "100 (nm)" between the region within the sector 103 and the region between sectors 103. That is, there is a the film thickness of the resist pattern between these regions and it is considered that a deviation is caused in the standing wave of the exposure beam in the film.

Moreover, in the reticle (photo mask) for forming the isolation regions 118, a small-width slit pattern is repeated within the sector 103 while the small-width slit pattern is absent in the region between sectors 103. Accordingly, it is considered that because of the exposure beam interference and the proximity effect, there is a difference in the exposure dimension between the peripheral portion and the center portion of the sector 103.

The applicant of the present invention, using a photo mask having a small-width slit pattern repeated at an identical interval, exposed resist films of various thickness values with the i-line exposure beam having a wavelength of "450 to 480 (nm)" to form developed resist patterns and measured dimensions corresponding to the diffused layer width W at a plurality of distances from the outermost end of the sector 103. The measurement results are shown in FIG. 3. As shown here, the pattern dimension fluctuation according to the distance from the end of the sector 103 varies depending on the resist film thickness.

For example, when the resist pattern film thickness is "919.7 (nm)" or "900.0 (nm)", the resist pattern dimension increases at the peripheral portion of the sector 103. In this case, the diffused layer width W increases at the peripheral portion of the sector 103 as in the conventional flash memory 100, which is not preferable for the flash memory 100 of the present embodiment.

On the other hand, it has been confirmed that when the resist film thickness is "888.9 (nm)", the resist pattern dimension is maintained almost constant over the entire region of the sector 103. In this case, the diffused layer width W is almost identical over the entire region of the sector 103, which is not preferable for the flash memory 100 of the present embodiment.

Moreover, it has been confirmed that when the resist film thickness is "875.5 (nm)", the resist pattern dimension is reduced at the peripheral portion of the sector 103. In this case, the diffused layer width W is reduced at the peripheral portion of the sector 103, which is preferable for the flash memory 100 of the present embodiment.

That is, when producing the flash memory 100 of the present embodiment, by forming the resist pattern of the diffused layer 117 with a resist film thickness of a predetermined range, the resist pattern dimension only in the peripheral portion of the sector 103 is set smaller than ideal value so as to obtain a diffused layer width W smaller than the ideal value.

In this case, the diffused layer width W is not increased in the peripheral portion of the sector 103 even if a production error is caused. Accordingly, it is possible to realize a flash memory 100 capable of reducing the number of memory cells 101 in a sector requiring charge supply, enabling a rapid data erase in the sector 103.

It should be noted that the resist film thickness is adjusted according to the volume photoresist dipped onto the semiconductor wafer, the diameter of the semiconductor wafer, rotation speed and time of the semiconductor wafer, and the like. Moreover, while the resist film thickness is exemplified to be "878.5 (nm) in the aforementioned embodiment, the most preferable value varies depending on various factors including the viscosity of the photoresist.

It should be noted that in the aforementioned embodiment, it appears that as the resist pattern film thickness is reduced, the resist pattern dimension in the peripheral portion of the sector 103 becomes smaller in width and as the film thickness is increased, the pattern dimension becomes greater in width. However, actually, no preferable result can be obtained when the resist pattern film thickness is too small or too great. In order to obtain a desired pattern dimension distribution in the sector 103, it is. necessary that the resist pattern film thickness-be within a predetermined range.

It should be noted that the present invention is not to be limited to the aforementioned embodiment but may be modified in various ways without departing from the concept of the present invention. For example, in the aforementioned embodiment, increase of the diffused layer width W is shown as the production error. However, the production error may be any that occurs in some of the memory cells 101 in a predetermined region of the sector 103 and lowers the erase speed.

For example, when a production error occurs in such a way that the overlap B of the FG 113 with respect to the element isolation region 118 is reduced in width in the memory cells 101 located in the peripheral portion of the sector 103, it is preferable that the overlap B of the memory-cells 101 in the peripheral portion of the sector 103 be formed with a greater width than the ideal value.

In this case, when producing the resist pattern for isolating the CG 114, by setting the photoresist thickness to "919.7 (nm)" or "900.0 (nm)", it is possible to increase the dimension of the photoresist pattern to become the overlap B in the peripheral portion of the sector 103.

Moreover, in the aforementioned embodiment, in order to reduce the number of the memory cells 101 in the sector 103 requiring the write-back processing in the flash memory 100 of the substrate erase method, the diffused layer width W in the peripheral portion of the sector 103 to become greater due to a production error is formed with a reduced width.

However, in the case that the flash memory 100 is of the source erase type, where the diffused layer width W in the peripheral portion of the sector 103 are reduced due to a production error, it is preferable that the diffused layer width W be formed with an increased width. For example, the resist pattern film thickness can be set to "900.0 (nm)" or "919.7 (nm)".

Similarly, in the source erase type flash memory 100, when a production error occurs in such a way that the overlap B in the peripheral portion of the sector 103 becomes greater, it is possible to set the film thickness of the resist pattern for isolating the CG 114 to "878.5 (nm)", so as to reduce the resist pattern dimension to become the overlap B in the peripheral portion of the sector 103.

Furthermore, in the aforementioned embodiment, an example has bee given on a flash memory 100 in which a data erase is performed in one or more sectors 103 at once. For example, however, the present invention can also be applied to EEPROM (not depicted) in which a data erase is performed in all the memory cells at once.

Moreover, in the aforementioned embodiment, explanation has been given on an example of controlling the diffused layer width W in a sector 103 by adjusting the film thickness of the resist pattern for forming the diffused layer 117. However, this can also be realized through the photo mask (not depicted) for patterning of the resist pattern of the diffused layer 117.

In this case, the photo mask for patterning of the resist pattern of the diffused layer 117 is formed in such a manner that the diffused layer width W in the peripheral portion of the sector 103 is smaller than the ideal value. In this case also, the diffused layer width w will not become greater in the peripheral portion of the sector 103 even if a production error occurs. Accordingly, it is possible to reduce the number of memory cells 101 in a sector 103 requiring electric charge supply and realize a flash memory 100 in which the data erase in one sector 103 is performed at a high speed.

The present invention having the aforementioned configuration has effects as follows.

In the semiconductor storage device according to the preset invention, some of the memory cells located at a position where a production error occurs are formed in a configuration that the erase speed is high than the ideal value even if the production error has occurred. Accordingly, in these memory cells, the erase speed is not lowered than the ideal speed even if the production error has occurred and has a high possibility that the data erase is executed more than necessary while in the other memory cells (most of the memory cells) the data erase is not performed more than necessary. Thus, as a whole (group), it is possible to reduce the number of cell having an excessive data erase and requiring the electric charge supply, which enables to rapidly complete the data erase as a whole (group). Moreover, this avoids need to produce a dummy pattern similar to the memory cells outside the group of the memory cells, which enables to increase the productivity of the semiconductor storage device and reduce the device size.

The invention may be embodied in other specific forms without departing from the spirit or essential characteristic thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent-Application No. 11-338634 (Filed on Nov. 29$^{th}$, 1999) including specification, claims, drawings and summary are incorporated herein by reference in its entirety.

What is claimed is:

1. A semiconductor storage device production method for producing a semiconductor storage device comprising a group of memory cells arranged in a two-dimensional state on a semiconductor substrate, wherein a binary data write is performed by pouring electric charge into each of the memory cells of the group until a cell threshold value reaches a predetermined write reference while a binary data erase is performed by uniformly discharging the electric charge from the memory cells until all the cell threshold values become below a predetermined erase reference and those memory cells subjected to the data erase and having cell threshold values below a lower limit are supplied with an electric charge, the device being characterized in that when a production error occurs in such a way that an erase speed of memory cells in a predetermined position of the group differs from an ideal value, the device is formed with a configuration to correct the erase speed of the memory cells in the predetermined position.

2. A semiconductor storage device production method as claimed in claim 1, wherein the production error occur in such a way that the erase speed of memory cells in the predetermined position of the group is lower than the ideal value and the device is formed with a configuration so as to increase the erase speed of the memory cells in the predetermined position to be higher than the ideal value.

3. A semiconductor storage device production method as claimed in claim 1, wherein the device is a substrate erase type semiconductor storage device including memory cells as MOS (metal oxide semiconductor) transistors in which a floating gate (FG) is located on a diffused layer and the binary data erase is performed by uniformly discharging electric charge from the memory cells to the semiconductor substrate, and wherein when the production error occurs in such a way that a width of the diffused layer of memory cells in the predetermined position of the group becomes greater than an ideal value, the memory cells in the predetermined position are formed with a diffused layer width smaller than the ideal value by the production error or more.

4. A semiconductor storage device production method as claimed in claim 3, wherein the predetermined position is a peripheral portion of the group.

5. A semiconductor storage production method as claimed in claim 1, wherein the device is a source erase type semiconductor storage device including memory cells as MOS transistors in which a floating gate (FG) is located on a diffused layer and the binary data erase is performed by uniformly discharging electric charge from the FG of the memory cells to source regions, and wherein when the production error occurs in such a way that a width of the diffused layer of memory cells in the predetermined position of the group becomes smaller than an ideal value, the memory cells in the predetermined position are formed with a diffused layer width greater than the ideal value by the production error or more.

6. A semiconductor storage device production method as claimed in claim 5, wherein the predetermined position is a peripheral portion of the group.

7. A semiconductor storage device production method as claimed in claim 1, wherein the device is a substrate erase type semiconductor storage device including memory cells as MOS transistors in which a floating gate (FG) is overlapped with an element isolation area and the binary data erase is performed by uniformly discharging electric charge from the memory cells to the semiconductor substrate, and wherein when the production error occurs in such a way that the overlap in memory cells in the predetermined position of the group becomes smaller than an ideal value, the memory cells in the predetermined position are formed with an overlap greater than the ideal value by the production error or more.

8. A semiconductor storage device production method as claimed in claim 7, wherein the predetermined position is a peripheral portion of the group.

9. A semiconductor storage device as claimed in claim 1, wherein the device is a source erase type semiconductor storage device including memory cells as MOS transistors in which a floating gate (FG) is overlapped with an element isolation area and the binary data erase is performed by uniformly discharging electric charge from the FG of the memory cells to source regions, and wherein when the production error occurs in such a way that the overlap in the memory cells in the predetermined position of the group becomes greater than an ideal value, the memory cells in the predetermined position are formed with an overlap smaller than the ideal value by the production error or more.

10. A semiconductor storage device production method as claimed in claim 9, wherein the predetermined position is a peripheral portion of the group.

* * * * *